United States Patent
Chen et al.

(10) Patent No.: US 7,309,901 B2
(45) Date of Patent: Dec. 18, 2007

(54) FIELD EFFECT TRANSISTORS (FETS) WITH MULTIPLE AND/OR STAIRCASE SILICIDE

(75) Inventors: Xiangdong Chen, LaGrangeville, NY (US); Sunfei Fang, LaGrangeville, NY (US); Zhijiong Luo, Carmel, NY (US); Haining Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 10/908,087

(22) Filed: Apr. 27, 2005

(65) Prior Publication Data
US 2006/0244075 A1 Nov. 2, 2006

(51) Int. Cl.
*H01L 21/8232* (2006.01)
(52) U.S. Cl. ............. 257/413; 257/288; 257/382; 438/305; 438/306; 438/303; 438/301; 438/231
(58) Field of Classification Search ............. 257/413, 257/382, 288, 284, 369, 347; 438/301–306, 438/231–232
See application file for complete search history.

(56) References Cited

U.S. PATENT DOCUMENTS

| | | | | |
|---|---|---|---|---|
| 5,962,895 A | * | 10/1999 | Beyer et al. | 257/347 |
| 2002/0008295 A1 | * | 1/2002 | Yang et al. | 257/413 |
| 2002/0137268 A1 | * | 9/2002 | Pellerin et al. | 438/197 |

* cited by examiner

*Primary Examiner*—Zandra V. Smith
*Assistant Examiner*—Tsz K Chiu
(74) *Attorney, Agent, or Firm*—Schmeiser, Olsen & Watts; Steven Capella

(57) ABSTRACT

A semiconductor structure and method for forming the same. The semiconductor structure comprises a field effect transistor (FET) having a channel region disposed between first and second source/drain (S/D) extension regions which are in turn in direct physical contact with first and second S/D regions, respective. First and second silicide regions are formed such that the first silicide region is in direct physical contact with the first S/D region and the first S/D extension region, whereas the second silicide region is in direct physical contact with the second S/D region and the second S/D extension region. The first silicide region is thinner for regions in contact with first S/D extension region than for regions in contact with the first S/D region. Similarly, the second silicide region is thinner for regions in contact with second S/D extension region than for regions in contact with the second S/D region.

9 Claims, 15 Drawing Sheets

FIELD EFFECT TRANSISTORS (FETS) WITH MULTIPLE AND/OR STAIRCASE SILICIDE

TECHNICAL FIELD

The present invention relates to field effect transistors (FETs), and more specifically, to staircase silicide FETs.

RELATED ART

In a typical field effect transistor (FET), there is a trade-off balance between (a) operation control and (b) resistance. More specifically, to have a better control of the threshold voltage Vt of the FET (so-called short channel effect), the FET's source/drain (S/D) extension regions which are in direct physical contact with the FET's channel region are formed as thin as possible. However, the thinner the S/D extension regions, the higher the resistances of these S/D extension regions, which is undesirable.

Therefore, there is a need for an FET (and a method for forming the same) which has a better trade-off balance between operation control and resistance than that of the prior art.

SUMMARY OF THE INVENTION

The present invention provides a semiconductor structure, comprising (a) a semiconductor layer including (i) a channel region and (ii) first and second source/drain (S/D) extension regions, and (iii) first and second S/D regions, wherein the channel region is disposed between and in direct physical contact with the first and second S/D extension regions, wherein the first S/D extension region is disposed between and in direct physical contact with the first S/D region and the channel region, and wherein the second S/D extension region is disposed between and in direct physical contact with the second S/D region and the channel region; (b) a gate dielectric region in direction physical contact with the channel region via a first interfacing surface that defines a reference direction essentially perpendicular to the first interfacing surface; (c) a gate region in direct physical contact with the gate dielectric region, wherein the gate dielectric region is sandwiched between and electrically insulates the gate region and the channel region; (d) a first shallow contact region in direct physical contact with the first S/D extension region; and (e) a first deep contact region in direct physical contact with the first S/D region and the first shallow contact region, wherein the first shallow contact region is physically isolated from the semiconductor layer by the first S/D region and the first S/D extension region, and wherein the first shallow contact region is thinner than the first deep contact region in the reference direction.

The present invention also provides a semiconductor structure fabrication method, comprising (A) providing a semiconductor structure comprising (a) a semiconductor layer including (i) a channel region and (ii) first and second source/drain (S/D) extension regions, and (iii) first and second S/D regions, wherein the channel region is disposed between and in direct physical contact with the first and second S/D extension regions, wherein the first S/D extension region is disposed between and in direct physical contact with the first S/D region and the channel region, and wherein the second S/D extension region is disposed between and in direct physical contact with the second S/D region and the channel region, (b) a gate dielectric region in direction physical contact with the channel region via a first interfacing surface that defines a reference direction essentially perpendicular to the first interfacing surface, and (c) a gate region in direct physical contact with the gate dielectric region, wherein the gate dielectric region is sandwiched between and electrically insulates the gate region and the channel region; and (B) forming (i) a first shallow contact region in direct physical contact with the first S/D extension region, and (ii) a first deep contact region in direct physical contact with the first S/D region and the first shallow contact region, wherein the first shallow contact region is physically isolated from the semiconductor layer by the first S/D region and the first S/D extension region, and wherein the first shallow contact region is thinner than the first deep contact region in the reference direction.

The present invention provides an FET (and a method for forming the same) which has a better trade-off balance between operation control and resistance than that of the prior art.

DETAILED DESCRIPTION OF THE INVENTION

Figure 1:
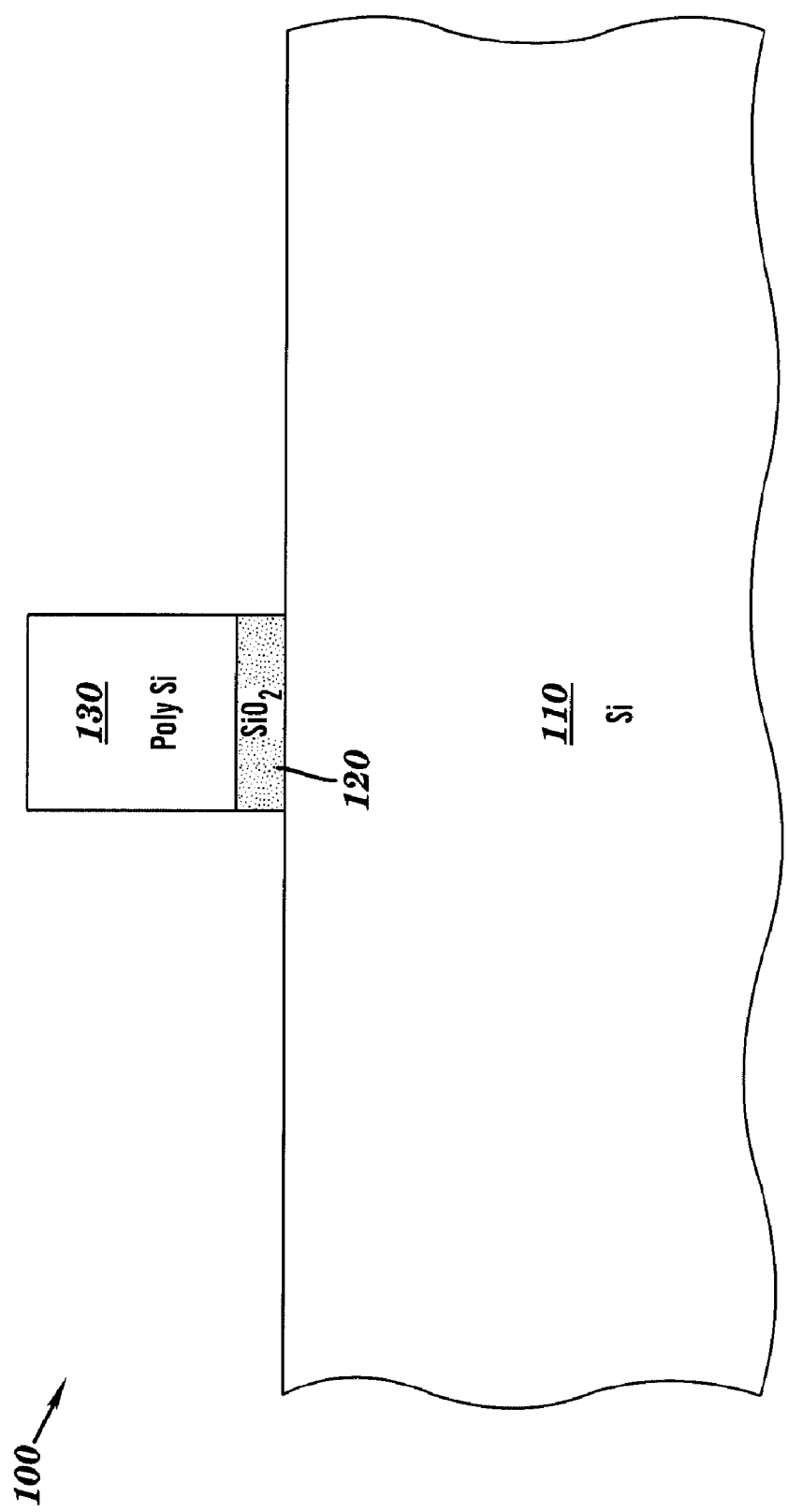
FIGS. 1-7 illustrate cross-section views of a first semiconductor structure going through steps of a first fabrication method, in accordance with embodiments of the present invention.

FIGS. 1-7 illustrate cross-section views of a first semiconductor structure 100 going through steps of a first fabrication method, in accordance with embodiments of the present invention. More specifically, with reference to FIG. 1, in one embodiment, the first fabrication method starts out with a semiconductor (e.g., silicon, germanium, etc.) substrate 110. Next, a gate stack 120,130 is formed on top of the semiconductor substrate 110. In one embodiment, the gate stack 120,130 comprises (i) a gate dielectric region 120 on the semiconductor substrate 110 and (ii) and a gate region 130 on the gate dielectric region 120. Illustratively, the gate dielectric region 120 comprises silicon dioxide ($SiO_2$) while the gate region 130 comprises doped polysilicon.

In one embodiment, the gate stack 120,130 is formed by (a) forming a gate dielectric layer (not shown) on the substrate 110, then (b) forming a gate layer (not shown) on the gate dielectric layer, and then (c) patterning a photoresist layer to define the gate stack, and (d) directionally etching back the gate layer and the gate dielectric layer stopping at the substrate 110 such that what remain of the gate layer and the gate dielectric layer after the etching are the gate region 130 and the gate dielectric region 120, respectively. The directional etching in step (d) may be performed using a traditional lithography process.

Figure 2:
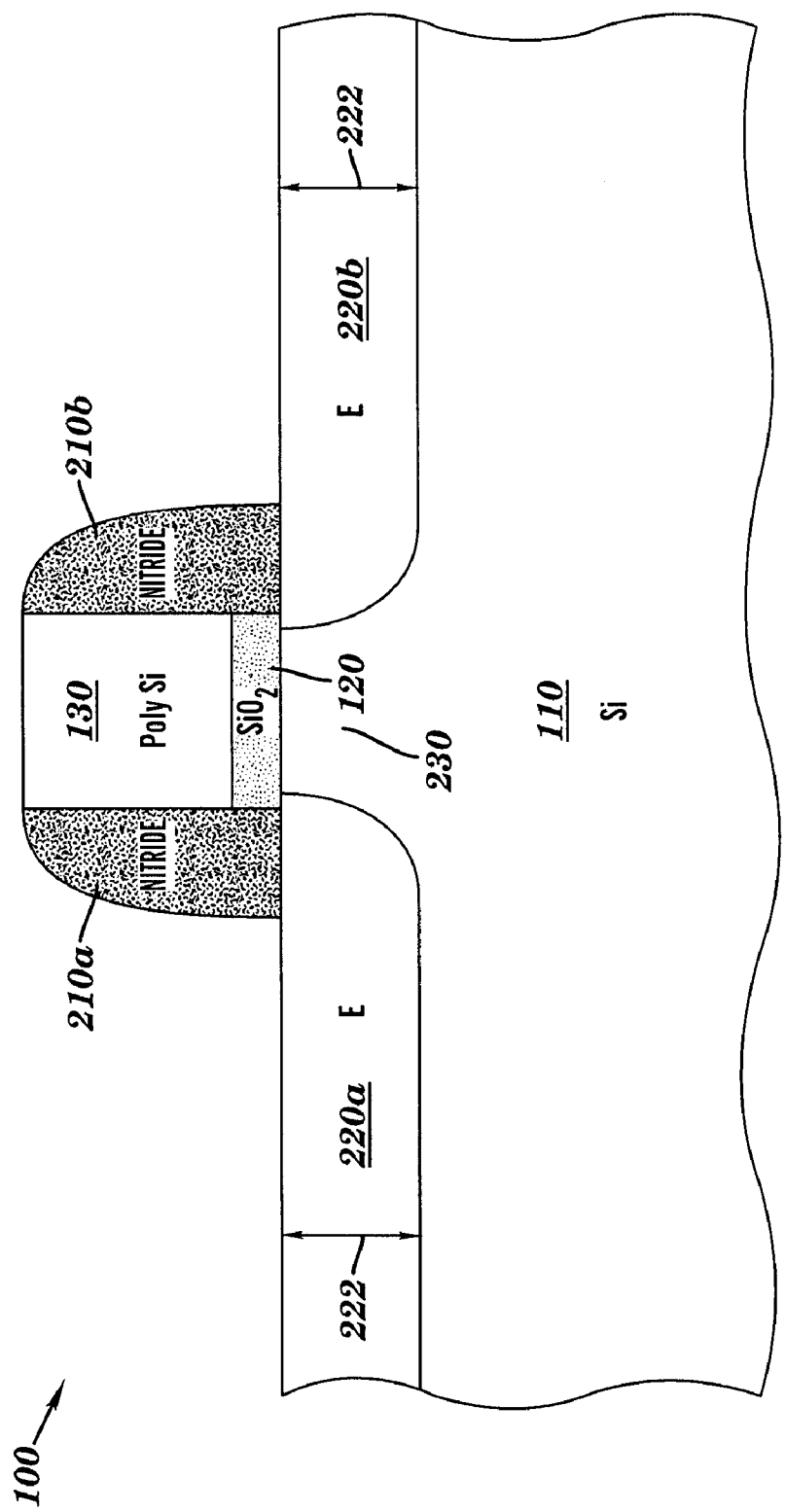

Next, in one embodiment, with reference to FIG. 2, extension spacers 210*a* and 210*b* are formed on side walls of the gate stack 120,130. Illustratively, the extension spacers 210*a* and 210*b* are formed by (a) depositing an extension spacer layer (not shown) on the entire structure 100 of FIG. 1, and then (b) directionally etching back the extension spacer layer, leaving the extension spacers 210*a* and 210*b* on side walls of the gate stack 120,130. In one embodiment, the extension spacers 210a and 210b comprise silicon nitride.

Next, the gate stack 120,130 and the extension spacers 210a and 210b are used as a blocking mask for forming source/drain (S/D) extension regions 220a and 220b in the semiconductor substrate 110 by, illustratively, ion implantation. As a result, a channel region 230 in the substrate 110 is defined that is (a) directly beneath and in direct physical contact with the gate dielectric region 120 and (b) disposed between and in direct physical contact with the S/D extension regions 220a and 220b.

If the structure 100 is to be an N channel field effect transistor (FET), then P type dopants (e.g. B and/or In) are implanted into the channel region 230 (concentration ~$10^{18}$-$10^{19}$ atoms/cm$^3$) and N type dopants (e.g., arsenic and/or phosphorous atoms) are implanted in the substrate 110 to form the S/D extension regions 220a and 220b with dopant concentration after S/D anneal being, illustratively, about $10^{19}$-$10^{20}$ atoms/cm$^3$. In contrast, if the structure 100 is to be a P channel FET, then N type dopants (e.g. As and/or P) are implanted into channel region (concentration ~$10^{18}$-$10^{19}$ atoms/cm$^3$) and P type dopants (e.g., boron atoms) are implanted in the substrate 110 to form the S/D extension regions 220a and 220b with dopant concentration after S/D anneal being, illustratively, about $10^{19}$-$10^{20}$ atoms/cm$^3$. In one embodiment, the thickness (depth) 222 of the S/D extension regions 220a and 220b is in a range of 20-40 nm after S/D anneal.

Figure 3:
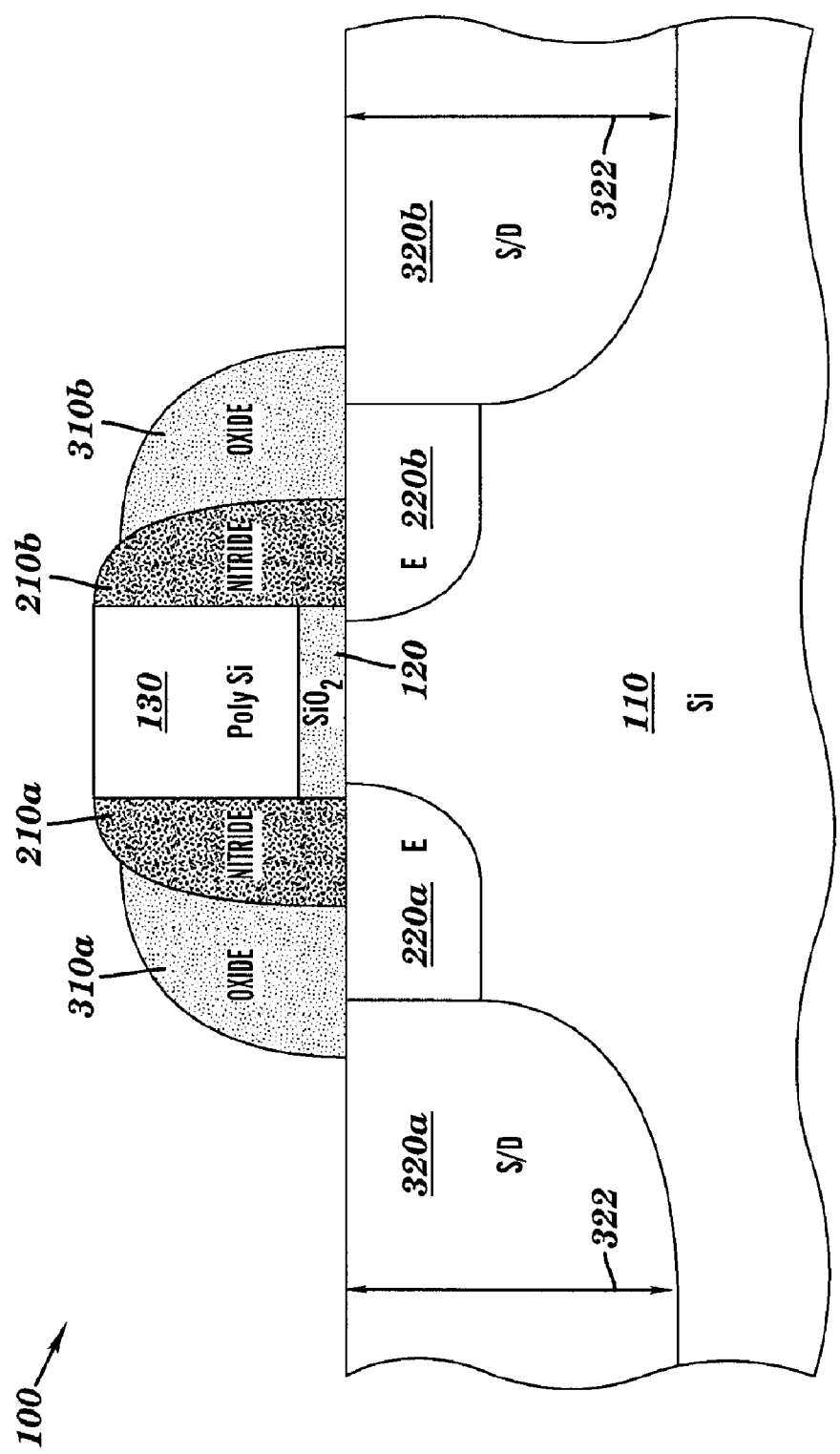

Next, with reference to FIG. 3, in one embodiment, S/D spacers 310a and 310b are formed on side walls of the extension spacers 210a and 210b, respectively. Illustratively, the S/D spacers 310a and 310b are formed by (a) depositing an S/D spacer layer (not shown) on the entire structure 100 of FIG. 2, and then (b) directionally etching back the S/D spacer layer, leaving the S/D spacers 310a and 310b on side walls of the extension spacers 210a and 210b, respectively. In one embodiment, the S/D spacers 310a and 310b comprise silicon dioxide (SiO$_2$).

Next, the gate stack 120,130, the extension spacers 210a and 210b, and the S/D spacers 310a and 310b are used as a blocking mask for forming S/D regions 320a and 320b in the semiconductor substrate 110 by, illustratively, ion implantation. Polysilicon region 130 receives S/D ion implantation in order to dope gate conductor to reduce resistance and electrical thickness of gate dielectrics. If the structure 100 is to be an N channel FET, then N type dopants (e.g., phosphorous atoms) are implanted in the substrate 110 to form the S/D regions 320a and 320b with dopant concentration after S/D anneal being, illustratively, $10^{20}$ atoms/cm$^3$. In contrast, if the structure 100 is to be a P channel FET, then P type dopants (e.g., boron atoms) are implanted in the substrate 110 to form the S/D regions 320a and 320b with dopant concentration after S/D anneal being, illustratively, $10^{20}$ atoms/cm$^3$. In one embodiment, after the S/D regions 320a and 320b are formed, a S/D anneal process (e.g., 950-1100 C. for 1-10 seconds and/or laser spike anneal) is performed to activate dopants in S/D extension regions 220a and 220b, the S/D regions 320a and 320b, and the polysilicon gate region 130. In one embodiment, the thickness (depth) 322 of the S/D regions 320a and 320b after the S/D anneal process is in a range of 50-150 nm.

Figure 4:
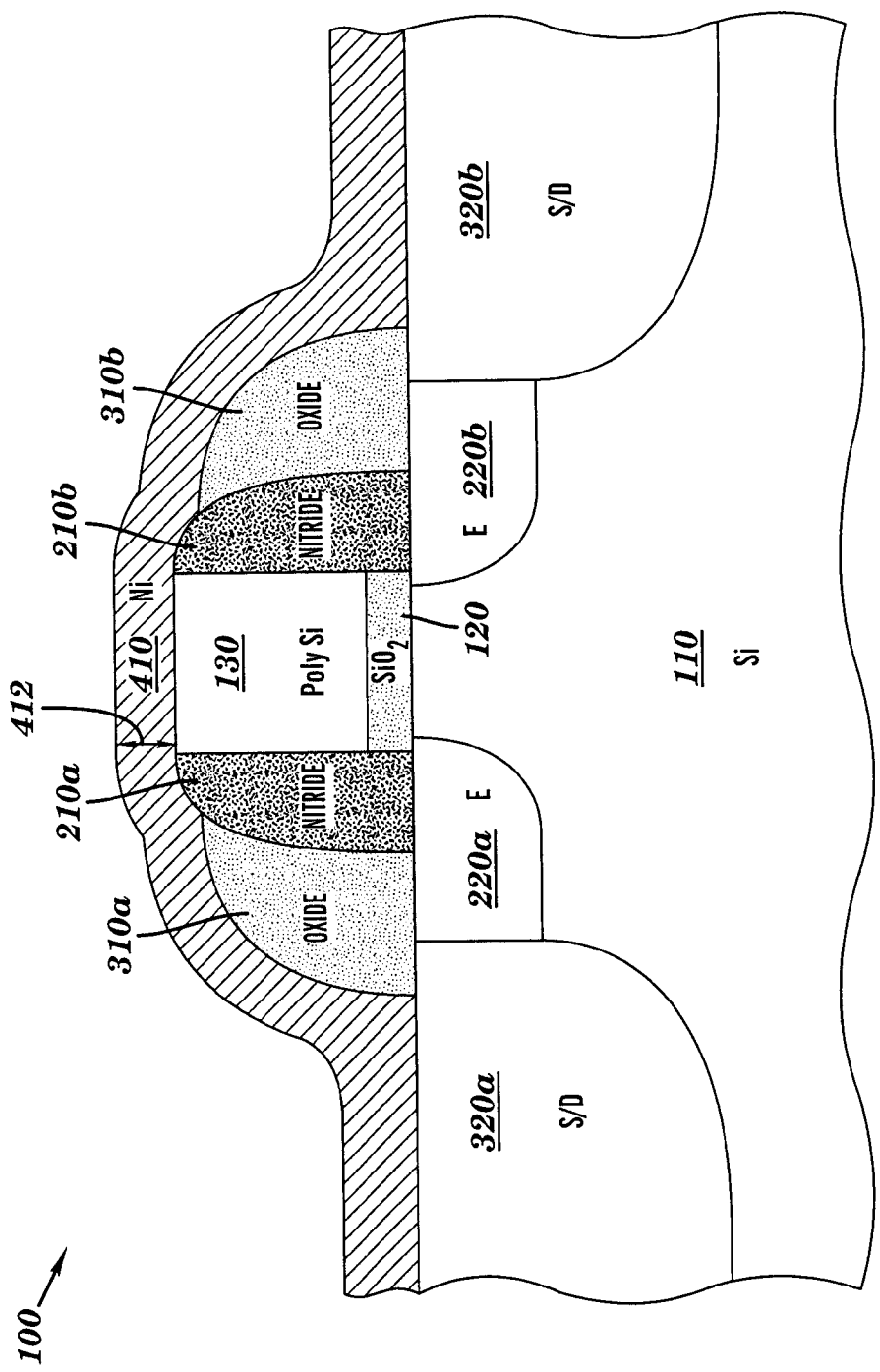

Next, with reference to FIG. 4, in one embodiment, a thick metal layer 410 is formed on top of the entire structure 100 of FIG. 3. Illustratively, the metal layer 410 comprises nickel (Ni) and has a thickness 412 in a range of 4-15 nm. The metal layer 410 may be formed by a physical vapor deposition process (PVD) or atomic layer deposition (ALD).

Figure 5:
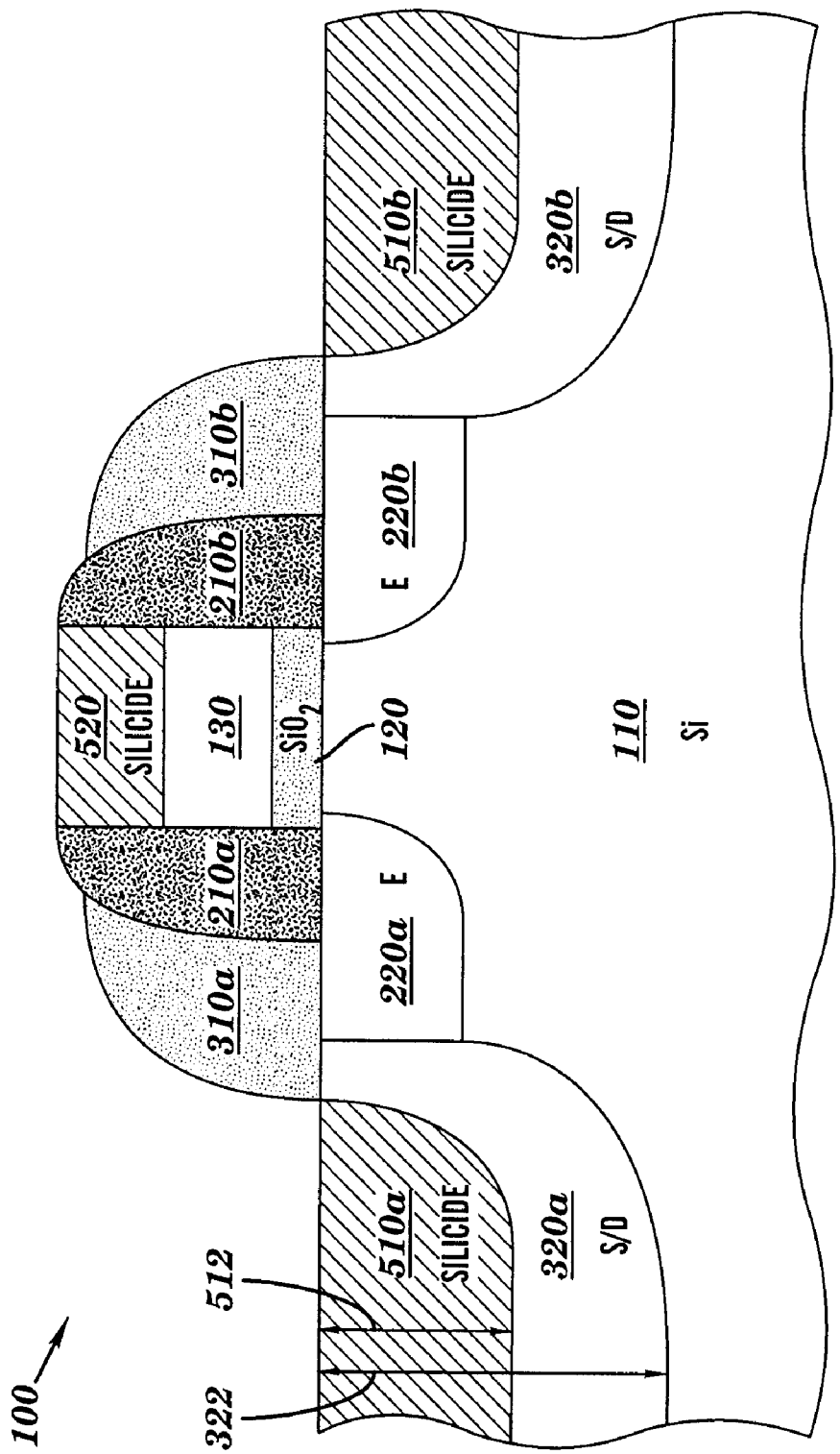

Next, in one embodiment, the structure 100 of FIG. 4 is annealed (heated) at a temperature in a range of 300-450° C. for about 1-10 sec so as to cause nickel of the metal layer 410 to (a) chemically react with silicon of the substrate 110 to form silicide nickel regions 510a and 510b (FIG. 5) and (b) chemically react with silicon of the polysilicon gate region 130 to form a silicide nickel region 520. Then, the unreacted nickel is removed by, illustratively, a wet etch step. The resultant structure 100 is shown in FIG. 5. With reference to FIG. 5, in one embodiment, the thickness 512 of the silicide regions 510a and 510b is less than the thickness 322 of the S/D regions 320a and 320b.

Figure 6:
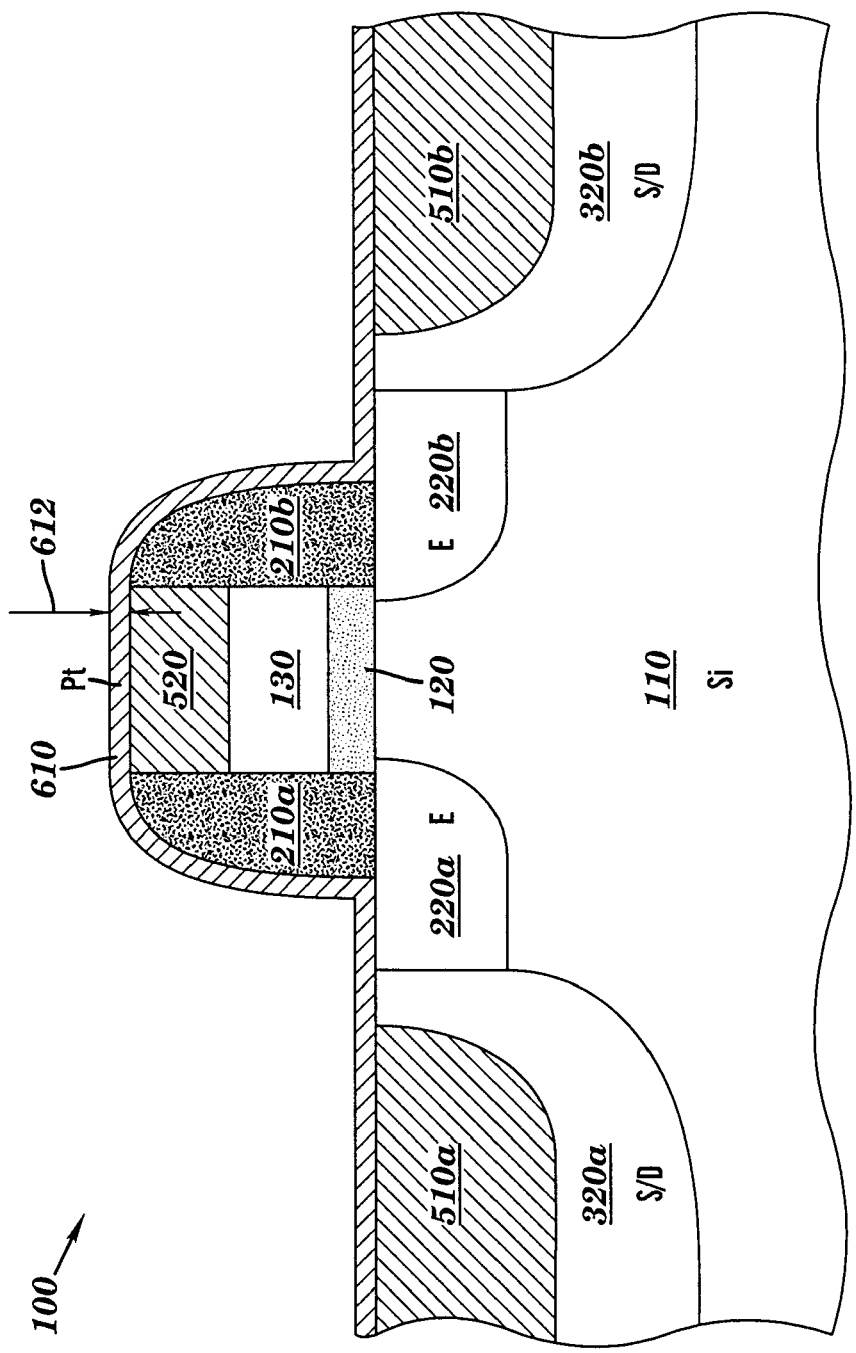

Next, with reference to FIG. 6, in one embodiment, the spacers of 310a and 310b (FIG. 5) are etched away and then a thin metal layer 610 is formed on top of the entire structure 100. Illustratively, the metal layer 610 comprises platinum (Pt) and has a thickness 612 in a range of 2-4 nm. The metal layer 610 may be formed by a physical vapor deposition (PVD) process or atomic layer deposition (ALD).

Figure 7:
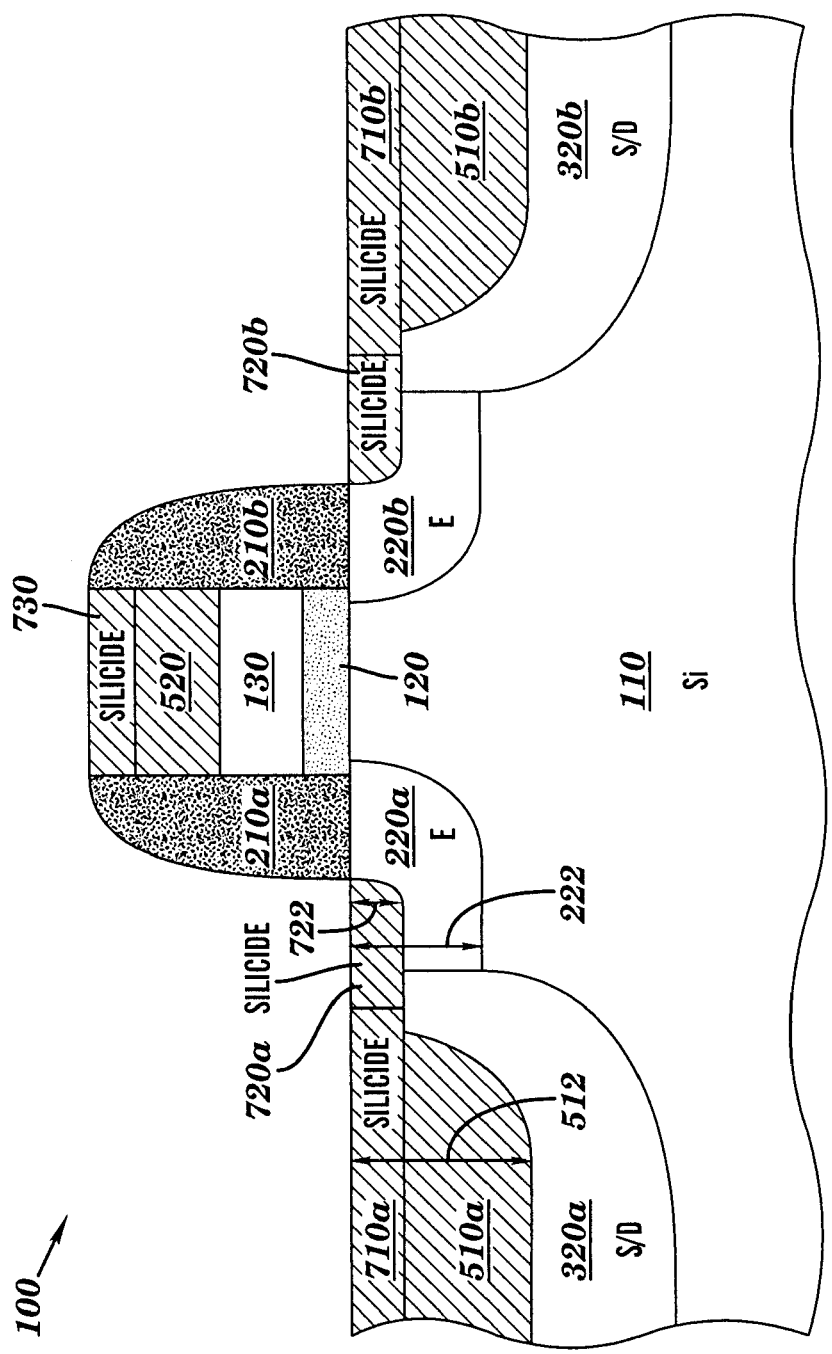

Next, in one embodiment, the structure 100 of FIG. 6 is annealed (heated) at a temperature in a range of, illustratively, 300-450° C. (preferably, this temperature range is selected so as to not change the property of silicide regions 510a and 510b) for about 1-10 sec so as to cause platinum of the metal layer 610 to (a) chemically react with NiSi of the silicide regions 510a and 510b to form NiPtSi regions 710a and 710b, respectively (FIG. 7), (b) chemically react with silicon of the substrate 110 to form silicide platinum (PtSi) regions 720a and 720b (FIG. 7), and (c) chemically react with NiSi on top of the gate region 130 to form a NiPtSi 730 (FIG. 7). Then, the unreacted platinum material is removed by, illustratively, a wet etch step. The resultant structure 100 is shown in FIG. 7. With reference to FIG. 7, in one embodiment, the thickness 722 of the PtSi regions 720a and 720b is less than the depth 222 of the S/D extension regions 220a and 220b, and is also less than the depth 512 of the silicide regions 510a and 510b.

FIGS. 8-11 illustrate cross-section views of a second semiconductor structure 200 going through steps of a second fabrication method, in accordance with embodiments of the present invention. More specifically, in one embodiment, the second fabrication method starts out with the structure 100 of FIG. 5. The same reference numerals will be used to indicate that the regions in the figures are similar.

Figure 8:
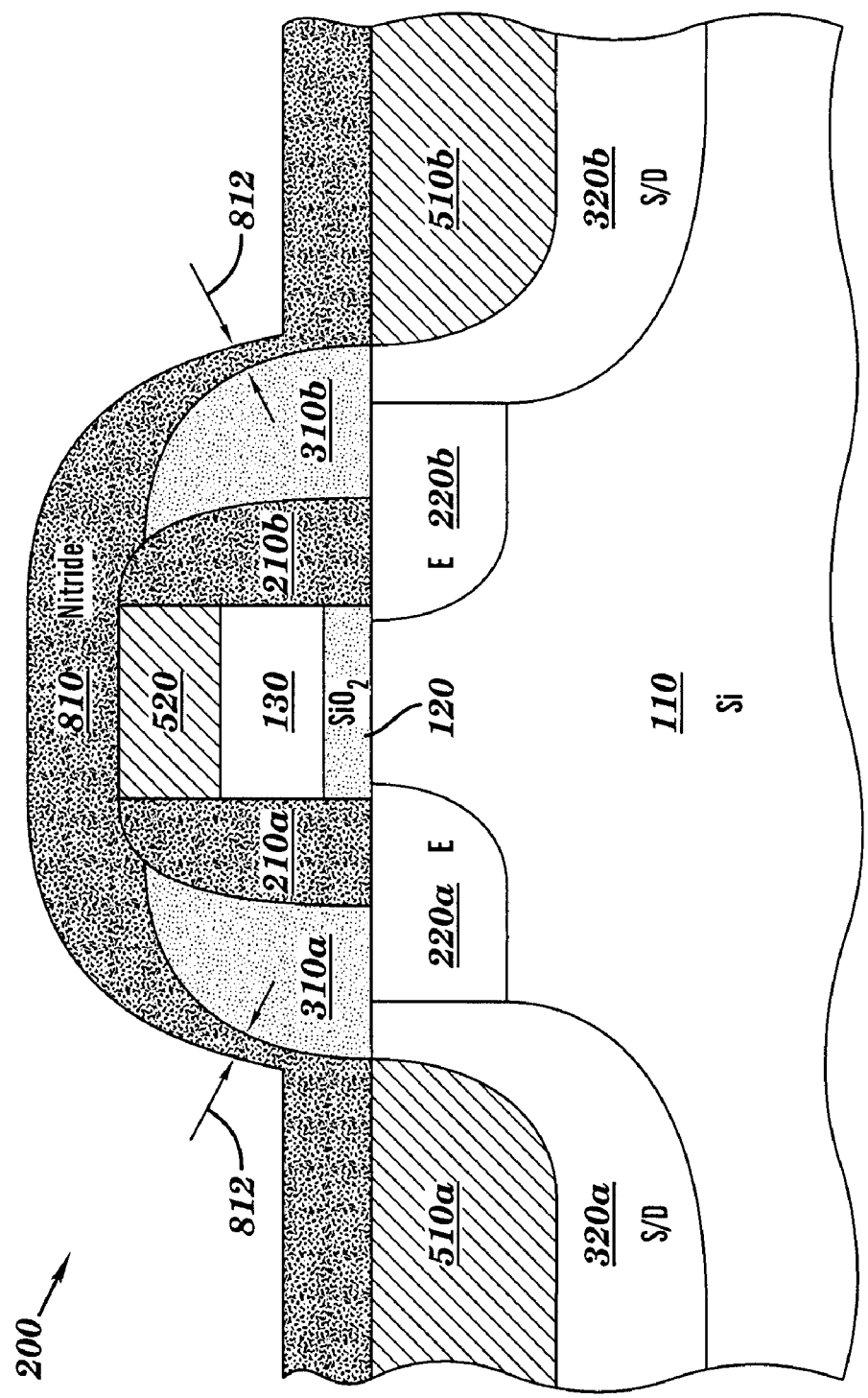
FIGS. 8-11 illustrate cross-section views of a second semiconductor structure going through steps of a second fabrication method, in accordance with embodiments of the present invention.

Next, with reference to FIG. 8, in one embodiment, a nitride layer 810 is directionally formed on top of the entire structure 100 of FIG. 5 such that the nitride layer 810 is thinnest (corresponding to the thickness 812) on side walls of the S/D spacers 310a and 310b. In one embodiment, the nitride layer 810 is formed by a plasma enhanced CVD process or high density plasma (HDP) deposition.

Figure 9:
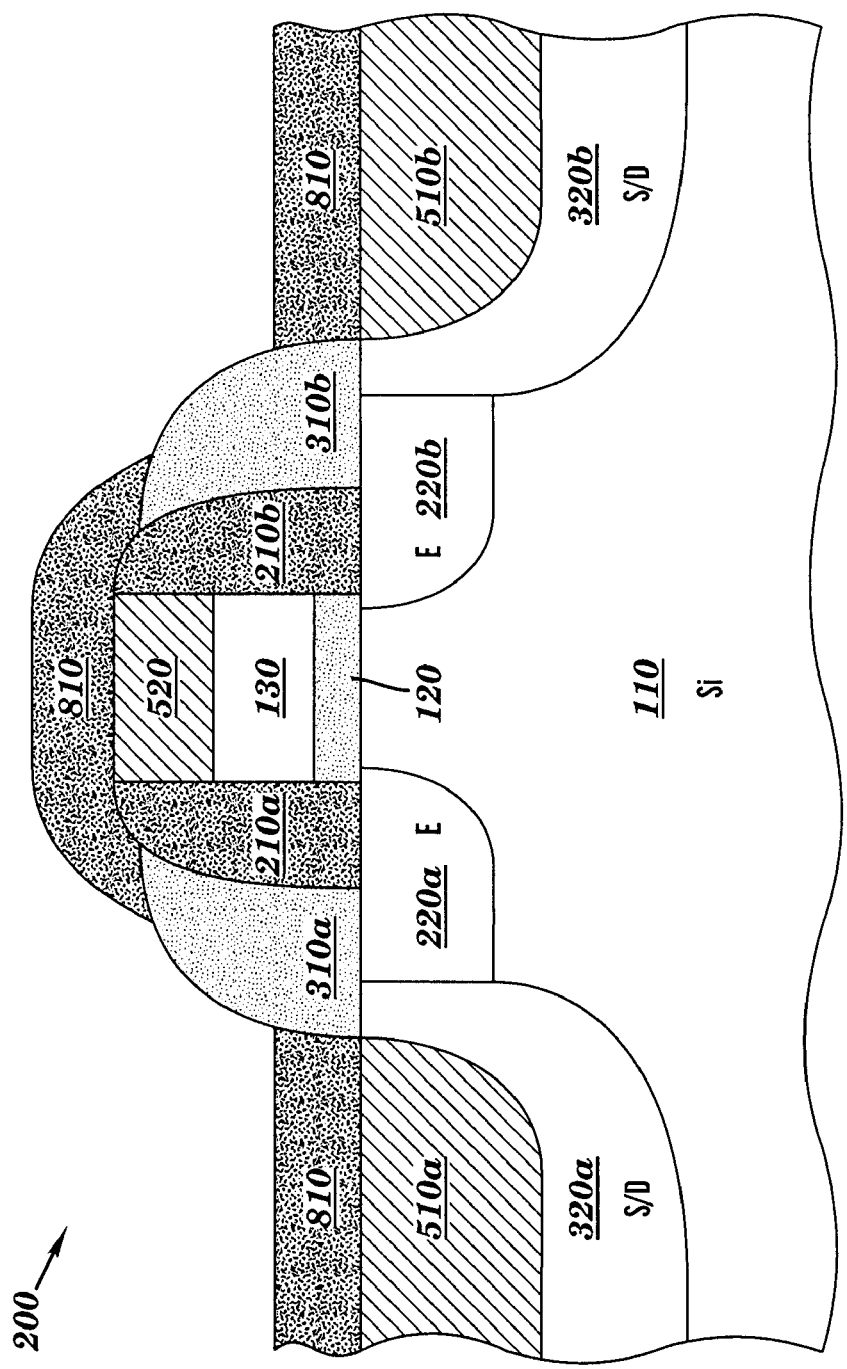

Next, the nitride layer 810 is isotropically etched back by, illustrative, a wet/dry etch process (non-directional) such that only portions of the nitride layer 810 that cover the S/D spacers 310a and 310b are etched. As a result, the S/D spacers 310a and 310b are partially exposed to the surrounding ambient. The resultant structure 200 is shown in FIG. 9. Next, the S/D spacers 310a and 310b are removed by, illustratively, a wet etch process.

Figure 10:
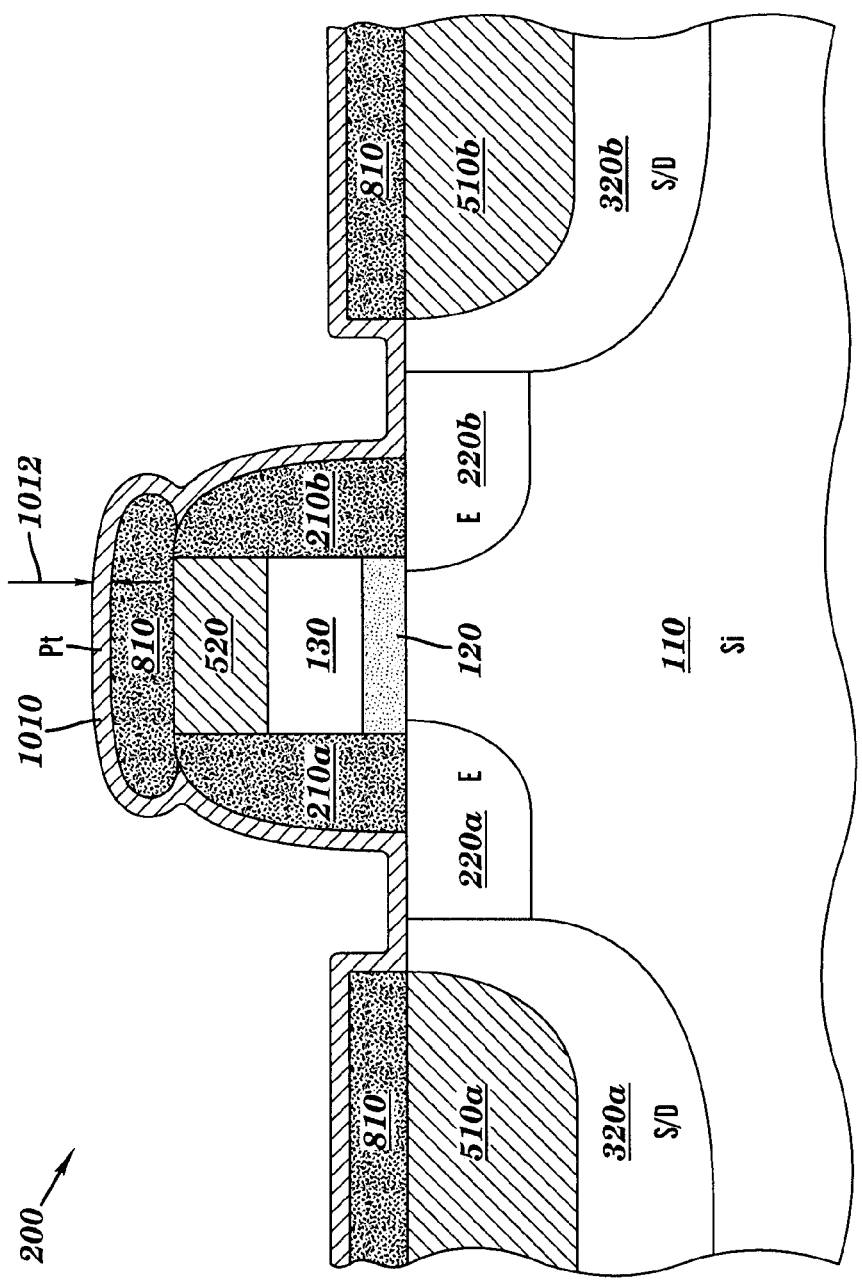

Next, with reference to FIG. 10, in one embodiment, a thin metal layer 1010 is formed on top of the entire structure 100 of FIG. 9 (with the S/D spacers 310a and 310b having been removed). Illustratively, the metal layer 1010 comprises platinum (Pt) and has a thickness 1012 in a range of 2-4 nm. The metal layer 1010 may be formed by a PVD process or atomic layer deposition (ALD).

Figure 11:
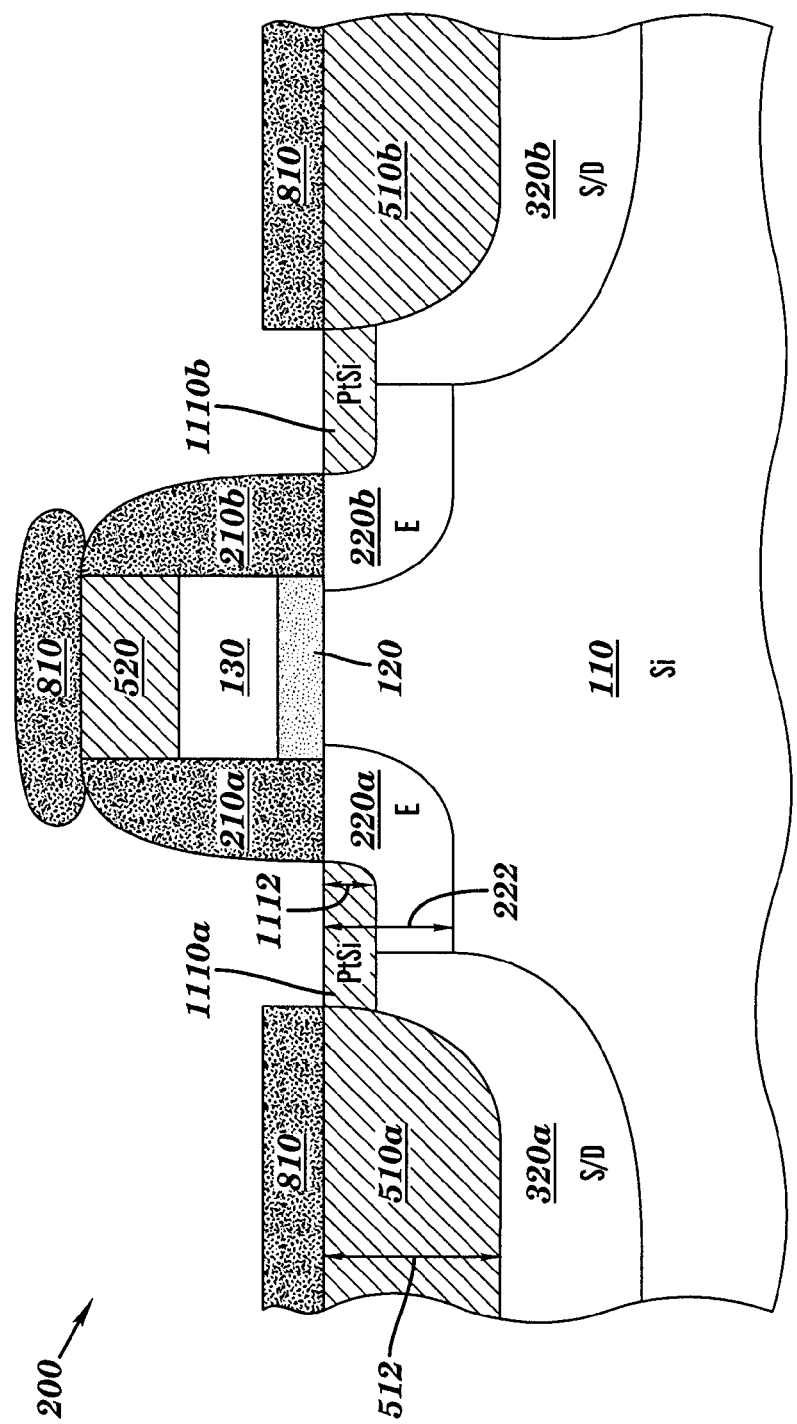

Next, in one embodiment, the structure 100 of FIG. 10 is annealed (heated) at a temperature in a range of, illustratively, 300-450° C. (preferably, this temperature range is selected so as to not change the property of suicide regions 510a and 510b) for about 1-10 sec so as to cause platinum of the metal layer 1010 to chemically react with silicon of the substrate 110 to form silicide platinum (PtSi) regions 1110a and 1110b (FIG. 11). Then, the unreacted platinum material is removed by, illustratively, a wet etch step. The resultant structure 200 is shown in FIG. 11. With reference to FIG. 11, in one embodiment, the thickness 1112 of the PtSi regions 1110a and 1110b is less than the depth 222 of the S/D extension regions 220a and 220b, and is also less than the depth 512 of the silicide regions 510a and 510b.

FIGS. 12-15 illustrate cross-section views of a third semiconductor structure 300 going through steps of a third fabrication method, in accordance with embodiments of the present invention. More specifically, in one embodiment, the third fabrication method starts out with the structure 100 of FIG. 3 with the oxide S/D spacers 310a and 310b being removed by, illustratively, a wet etch process. The same reference numerals will be used to indicate that the regions in the figures are similar.

Figure 12:
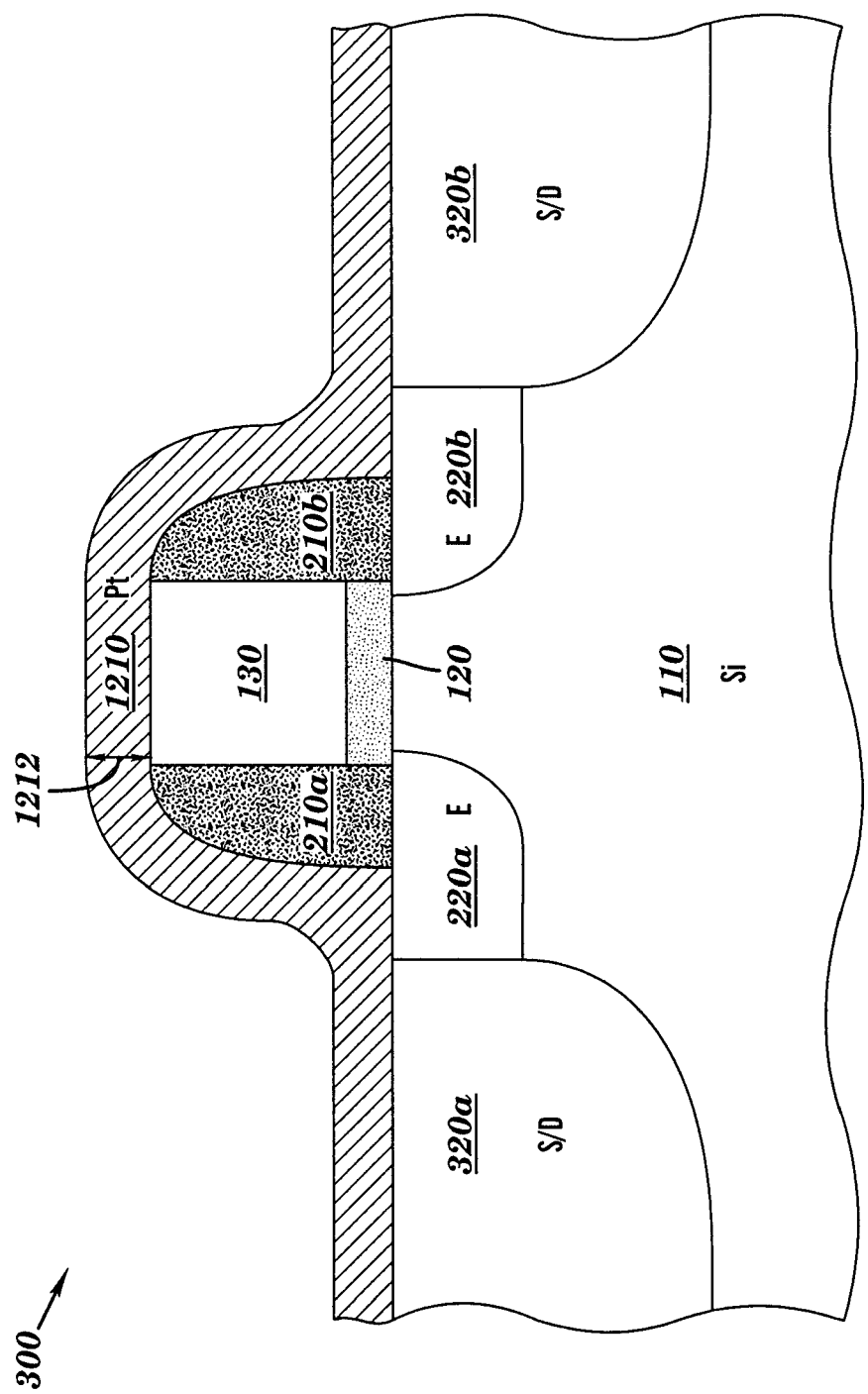
FIGS. 12-15 illustrate cross-section views of a third semiconductor structure going through steps of a third fabrication method, in accordance with embodiments of the present invention.

Next, with reference to FIG. 12, in one embodiment, a thin metal layer 1210 is formed on top of the entire structure 100 of FIG. 3 (with the oxide S/D spacers 310a and 310b having being removed). Illustratively, the metal layer 1210 comprises platinum (Pt) and has a thickness 1212 in a range of 2-4 nm. The metal layer 1210 may be formed by a PVD process or atomic layer deposition (ALD). In an alternative embodiment, the metal layer 1210 comprises a nickel platinum alloy with nickel percentage being smaller than 5% in molecule number.

Figure 13:
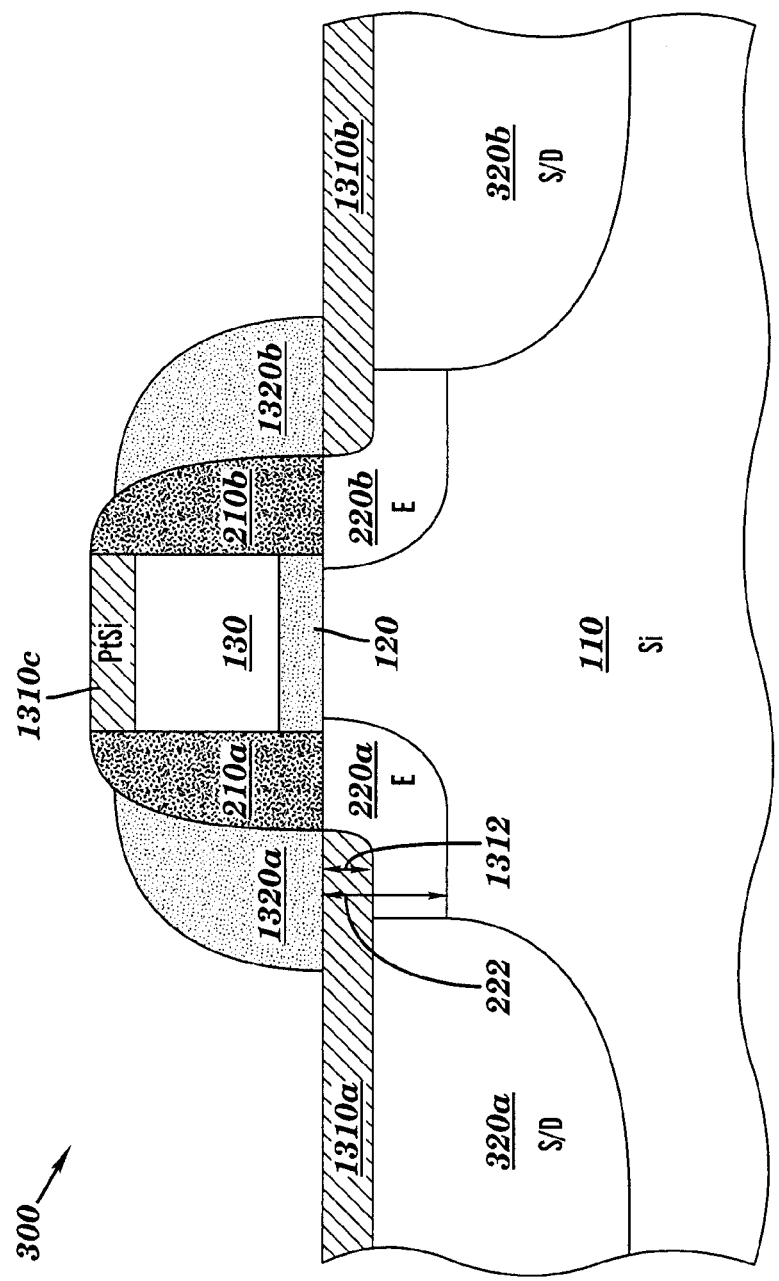

Next, in one embodiment, the structure 300 of FIG. 12 is annealed (heated) at a temperature in a range of, illustratively, 300-450° C. for about 10 sec so as to cause platinum of the metal layer 1210 to (a) chemically react with silicon of the substrate 110 to form silicide platinum (PtSi) regions 1310a and 1310b (FIG. 13) and (b) chemically react with silicon of the polysilicon gate region 130 to form a silicide platinum region 1310c (FIG. 13). Then, the unreacted platinum material is removed by, illustratively, a wet etch step. The resultant structure 300 is shown in FIG. 13. With reference to FIG. 13, in one embodiment, the thickness 1312 of the PtSi regions 1310a and 1310b is less than the depth 222 of the S/D extension regions 220a and 220b.

Next, in one embodiment, spacers 1320a and 1320b are formed on side walls of the extension spacers 210a and 210b, respectively. The spacers 1320a and 1320b may comprise silicon dioxide (SiO₂).

Figure 14:
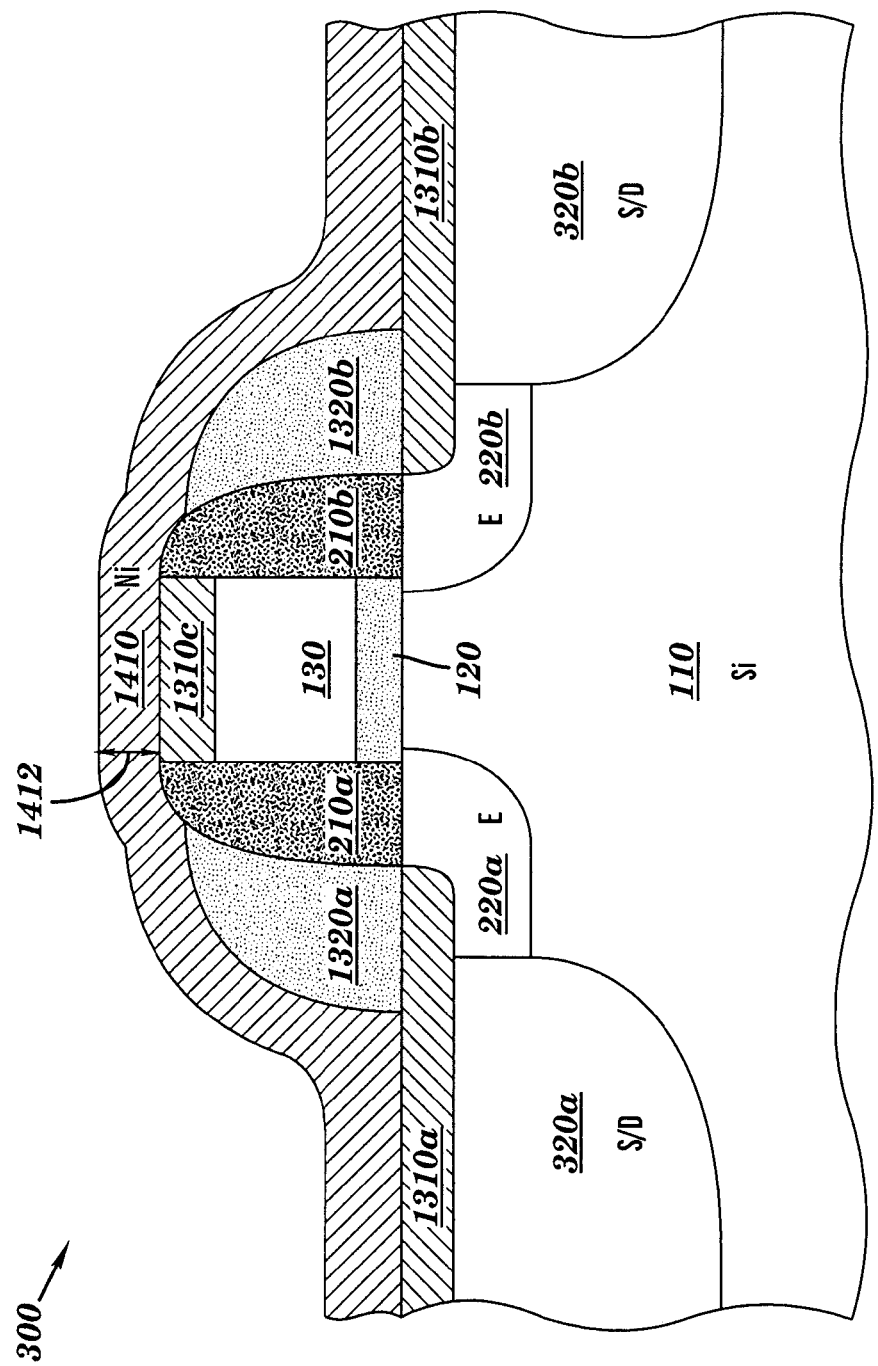

Next, with reference to FIG. 14, in one embodiment, a thick metal layer 1410 is formed on top of the entire structure 300 of FIG. 13. Illustratively, the metal layer 1410 comprises nickel (Ni or NiPt) and has a thickness 1412 in a range of 4-15 nm. The metal layer 1410 may be formed by a CVD process.

Figure 15:
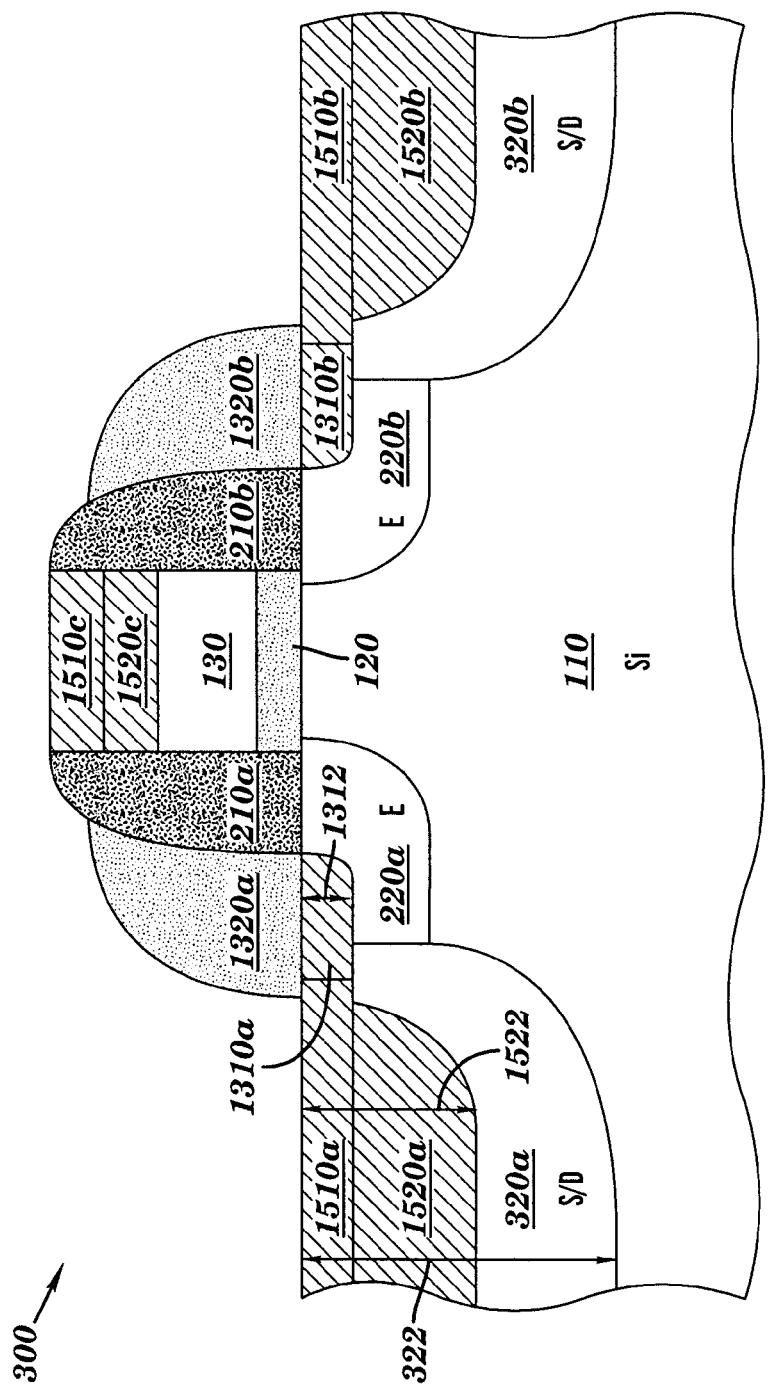

Next, in one embodiment, the structure 300 of FIG. 14 is annealed (heated) at a temperature in a range of, illustratively, 300-450° C. (preferably, this temperature range is selected so as to not change the property of portions of the silicide regions 1310a and 1310b directly under the spacers of 1320a and 1320b, respectively) for about 1-10 sec so as to cause nickel (or NiPt) of the metal layer 1410 to (a) chemically react with NiSi of the silicide regions 1310a and 1310b to form NiPtSi regions 1510a and 1510b, respectively (FIG. 15), (b) diffuse down and chemically react with silicon of the substrate 110 to form silicide platinum (PtSi) regions 1520a and 1520b (FIG. 15), (c) chemically react with PtSi of the silicide region 1310c to form a NiPtSi region 1510c (FIG. 15), and (d) diffuse down and chemically react with silicon of the polysilicon gate region 130 to form NiSi 1520c (FIG. 15). Then, the unreacted nickel material is removed by, illustratively, a wet etch step. The resultant structure 300 is shown in FIG. 15. With reference to FIG. 15, in one embodiment, the depth 1522 of the PtSi regions 1520a and 1520b is less than the depth 322 of the S/D regions 320a and 320b, but is greater than the depth 1312 of the PtSi regions 1310a and 1310b.

In summary, with reference to FIGS. 7, 11, and 15, in the three structures 100, 200, and 300, portions of the S/D extension regions 220a and 220b and the S/D regions 320a and 320b are replaced by electrically conducting silicide materials (PtSi, NiSi, and NiPtSi) as much as possible, without eliminating the junctions between the S/D extension regions 220a and 220b and the substrate 110 as well as the junctions between the S/D regions 320a and 320b and the substrate 110. In other words, the suicide regions (also referred to as the contact regions) are formed thinner in the S/D extension regions 220a and 220b and thicker in the S/D regions 320a and 320b. For instance, with reference to FIG. 7, the contact region 510a,710a,720a is thinner in the S/D extension regions 220a (thickness 722) and thicker in the S/D regions 320a (thickness 512). Similarly, the contact region 510b,710b,720b is thinner in the S/D extension regions 220a and thicker in the S/D regions 320a.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
(a) a semiconductor layer including (i) a channel region and (ii) first and second source/drain (S/D) extension regions, and (iii) first and second S/D regions,
   wherein the channel region is disposed between and in direct physical contact with the first and second S/D extension regions,
   wherein the first S/D extension region is disposed between and in direct physical contact with the first S/D region and the channel region, and
   wherein the second S/D extension region is disposed between and in direct physical contact with the second S/D region and the channel region;
(b) a gate dielectric region in direction physical contact with the channel region via a first interfacing surface that defines a reference direction essentially perpendicular to the first interfacing surface;
(c) a gate region in direct physical contact with the gate dielectric region, wherein the gate dielectric region is sandwiched between and electrically insulates the gate region and the channel region;
(d) a first shallow contact region in direct physical contact with the first S/D extension region; and
(e) a first deep contact region in direct physical contact with the first S/D region and the first shallow contact region,
   wherein the first shallow contact region is physically isolated from the semiconductor layer by the first S/D region and the first S/D extension region, and
   wherein the first shallow contact region is thinner than the first deep contact region in the reference direction; and (f) a dielectric cap layer on top of and in direct physical contact with the first deep contact region,
  wherein a top surface of the first shallow contact region is exposed to a surrounding ambient environment through a first opening of the dielectric cap layer.

2. The structure of claim 1, wherein the first deep contact region is physically isolated from the semiconductor layer by the first S/D region and the first S/D extension region.

3. The structure of claim 1, further comprising:
a second shallow contact region in direct physical contact with the second S/D extension region;
a second deep contact region in direct physical contact with the second S/D region and the second shallow contact region,
wherein the second shallow contact region is physically isolated from the semiconductor layer by the second S/D region and the second S/D extension region,
wherein the second shallow contact region is thinner than the second deep contact region in the reference direction,
wherein the dielectric cap layer is on top of and in direct physical contact with the second deep contact region, and
wherein a top surface of the second shallow contact region is exposed to the surrounding ambient environment through a second opening of the dielectric cap layer.

4. The structure of claim 3, wherein the second deep contact region is physically isolated from the semiconductor layer by the second S/D region and the second S/D extension region.

5. The structure of claim 1,
wherein the first shallow contact region comprises a first silicide material, and
wherein the first deep contact region comprises a second silicide material.

6. The structure of claim 5, wherein the first silicide material is different from the second silicide material.

7. The structure of claim 6,
wherein the first silicide material comprises suicide platinum, and
wherein the second silicide material comprises silicide nickel.

8. The structure of claim 1, wherein the first S/D region is thicker than the first S/D extension region in the reference direction.

9. The structure of claim 8, wherein the second S/D region is thicker than the second S/D extension region in the reference direction.

* * * * *